US007358870B2

(12) United States Patent
Bay

(10) Patent No.: US 7,358,870 B2
(45) Date of Patent: Apr. 15, 2008

(54) HUFFMAN CODING AND DECODING BASED UPON SECTIONING OF A HUFFMAN CODING TREE

(75) Inventor: Jiunn Bay, Takane-cho (JP)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/568,009

(22) PCT Filed: Sep. 2, 2003

(86) PCT No.: PCT/IB03/04310

§ 371 (c)(1),
(2), (4) Date: Feb. 9, 2006

(87) PCT Pub. No.: WO2005/022754

PCT Pub. Date: Mar. 10, 2005

(65) Prior Publication Data

US 2006/0290537 A1 Dec. 28, 2006

(51) Int. Cl.
*H03M 7/40* (2006.01)
(52) U.S. Cl. .......................................... 341/65; 341/67
(58) Field of Classification Search .................. 341/65, 341/67, 50, 106
See application file for complete search history.

(56) References Cited

U.S. PATENT DOCUMENTS

| | | | | | |
|---|---|---|---|---|---|
| 4,821,290 | A | * | 4/1989 | Hingorani et al. | 375/242 |
| 5,541,595 | A | * | 7/1996 | Meyer | 341/67 |
| 5,550,542 | A | * | 8/1996 | Inoue | 341/67 |
| 5,955,980 | A | * | 9/1999 | Hanna | 341/120 |
| 5,973,626 | A | * | 10/1999 | Berger et al. | 341/65 |
| 6,188,797 | B1 | | 2/2001 | Moledina et al. | 382/246 |
| 6,603,413 | B2 | * | 8/2003 | Igarashi et al. | 341/67 |
| 6,661,358 | B1 | * | 12/2003 | Hashimoto | 341/67 |
| 6,958,718 | B2 | * | 10/2005 | Symes et al. | 341/106 |
| 7,113,115 | B2 | * | 9/2006 | Partiwala et al. | 341/67 |

FOREIGN PATENT DOCUMENTS

EP 1 341 314 A2 9/2003

OTHER PUBLICATIONS

Jiang, J. et al., "An Efficient Huffman Decoding Method Based on Pattern Partition and Look-Up Table", Communications, 1999, APCC/OECC'99, 5th Asia-Pacific Conference on . . . and 4th Optoelectronics and Communications Conference, vol. 2, 1999, pp. 904-907.

(Continued)

*Primary Examiner*—Peguy JeanPierre
(74) *Attorney, Agent, or Firm*—Harrington & Smith, PC

(57) ABSTRACT

A method of decoding a bitstream encoded according to a Huffman coding tree of height H including: extracting a first codeword of H bits from the bitstream; modifying the codeword by shifting it by a first shift value; using this modified codeword to identify using at least a first data structure either a symbol or a second data structure having an associated second offset value and an associated second shift value; and if a second data structure is identified using the first data structure: modifying the codeword by subtracting the second offset value and shifting the result by the second shift value; and using this modified codeword to identify using the second data structure either a symbol or a third data structure having an associated third offset value and an associated third shift value.

42 Claims, 4 Drawing Sheets

OTHER PUBLICATIONS

Chung, K., et al., "Level-Compressed Huffman Decoding", IEEE Transactions on Communications, vol. 47, No. 10, Oct. 1999, pp. 1455-1457.

Choi, S., et al., "High Speed Pattern Matching for a Fast Huffman Decoder", Consumer Electronics, IEEE Transactions, Nov. 14, 1994, pp. 97-103.

Hashemian, R., "Memory Efficient and High-Speed Search Huffman Coding", IEEE Transactions on Communications, vol. 43, No. 10, Oct. 1995, pp. 2576-2581.

Chen, H., et al., "A Memory-Efficient and Fast Huffman Decoding Algorithm", Information Processing Letters 69, 1999, pp. 119-122.

Kim, B., et al., "An Efficient Search of Binary Tree for Huffman Decoding Based on Numeric Interpretation of Codewords", 2002 International Technical Conference, Jul. 16-19, 2002, Phuket, Thailand, 4 pgs.

Aggarwal, M., et al., "Efficient Huffman Decoding", Image Processing, 200, Proceedings, 200, International Conference Sep. 10-13, 2000, pp. 936-939.

Chowdhury, R., et al., "An Efficient Decoding Technique for Huffman Codes", Information Processing Letters, 2002, vol. 81, No. 6, pp. 305-308.

Shieh, B., et al., "A High-throughput Memory-Based VLC Decoder with Codeword Boundary Prediction", IEEE Transactions on Circuits and Systems for Video Technology, vol. 10, No. 8, Dec. 2000, pp. 1514-1521.

\* cited by examiner

HUFFMAN CODING AND DECODING BASED UPON SECTIONING OF A HUFFMAN CODING TREE

This application is a 371 of PCT/IB03/04310 filed Sep. 2, 2003.

FIELD OF THE INVENTION

Embodiments of the present invention relate to Huffman encoding and decoding. In particular they relate to improved mechanisms for encoding and decoding and an improved representation of a Huffman tree.

BACKGROUND TO THE INVENTION

In digital processing, if a message comprises a sequence of symbols, each distinct symbol can be represented as a distinct binary codeword. Huffman's algorithm uses a table of the frequencies of occurrence of each symbol in a message and optimizes the variable length codewords such that the most frequent codeword has the shortest length. This results in data compression and Huffman coding is commonly used in audio and video compression coding, for example, MPEG.

"A method for the construction of minimum-redundancy codes", by David A Huffman, Proceedings of the IRE 40 (1952) 1098-1101, introduces Huffman Coding.

If there are nine symbols S0, S1 . . . S8 with the following respective frequencies of occurrence 5, 5, 6, 1, 2, 3, 16, 9, 9, then they can be encoded using the Huffman algorithm into the binary tree illustrated in FIG. 1.

The tree 10 comprises leaf nodes Si and interior nodes Fi arranged in H levels. Each leaf node depends from a single interior node on the next lowest level and represents a symbol. Each interior node depends from a single interior node on the next lowest level. The level L of a node is defined by setting the root to level 0, and the other nodes have a level that is one higher that the level of the node from which it depends. The highest level is the height H of the Huffman tree. The symbols (i.e. the leaves of T) are labelled from left to right as S0, S1, S2 . . . S8.

The Huffman tree illustrated in FIG. 1 results in the following coding of the symbols

TABLE 1

| Symbol | Codeword |
| --- | --- |
| S0 | 000 |
| S1 | 001 |
| S2 | 010 |
| S3 | 01100 |
| S4 | 01101 |
| S5 | 0111 |
| S6 | 10 |
| S7 | 110 |
| S8 | 111 |

In its simplest representation, a Huffman binary tree of height H may be represented using a word for each node of the tree. The size of such a representation makes it difficult to search during decoding.

"Memory efficient and high speed search Huffman coding", by Hashemian, IEEE Trans on Comms, Vol. 43, No 10, 2576-, October 1995, reduces the storage space required to represent a Huffman tree and increases the decode speed using the tree. A sparse single-side growing Huffman tree is created and partitioned into smaller and less sparse clusters (sub-trees), each L levels apart. A super-tree is constructed in which each cluster is represented by a node. A super table specifies the super-tree. It specifies, for each node, the length of the cluster associated with that node and the address of the look up table for that cluster. A negative entry in the look-up table is a reference back to the super-table. A positive entry indicates that a symbol has been found and the magnitude of the entry provides the location of the symbol in memory, the codeword and the codeword length.

In "A memory-efficient and fast Huffman decoding algorithm", by Chen, Inform Process Lett. 69 (1999) 119-122, weight is given to a leaf node equal to the number of leaves in a complete tree under the node. It is dependent upon the level of the node within the tree. Every leaf node is assigned a number equal to the cumulative weight of all the leaves appearing before it and its own weight. A codeword is given an equivalent cumulative weight as if it were a node on a tree. The actual cumulative weights are searched to determine if one matches the equivalent cumulative weight. If there is a match and the weights of the matching nodes are the same, then the codeword is a leaf node of the tree (i.e. a symbol).

"An efficient decoding technique for Huffman codes", Chowdhury et al, Inform Process Lett, 81 (2002), 305-308, truncates a Huffman tree by removing all the leaves to improve memory use and search speed.

It would be desirable to provide an alternative representation of a Huffman binary tree and an improved Huffman decoding mechanism for decoding a received string of binary digits.

BRIEF DESCRIPTION OF THE INVENTION

According to one embodiment of the invention there is provided a method of decoding a bitstream encoded according to a Huffman coding tree of height H comprising:
extracting a first codeword of H bits from the bitstream;
modifying the codeword by shifting it by a first shift value;
using this modified codeword to identify using at least a first data structure either a symbol or a second data structure having an associated second offset value and an associated second shift value; and
if a second data structure is identified using the first data structure:
modifying the codeword by subtracting the second offset value and shifting the result by the second shift value; and
using this modified codeword to identify using the second data structure either a symbol or a third data structure having an associated third offset value and an associated third shift value.

According to another embodiment of the invention there is provided a method of decoding a bitstream encoded according to a Huffman coding tree of height H comprising:
extracting a codeword of H bits from the bitstream;
shifting the codeword by a predetermined shift value; and
using the modified codeword to identify a symbol using at least a first data structure.

According to another embodiment of the invention there is provided a decoder for decoding a bitstream encoded according to a Huffman coding tree of height H comprising:
a memory for storing a plurality of data structures representing the Huffman coding tree of height H including at least a first data structure having an associated first offset value and an associated first shift value and a second data structure having an associated second offset value and an associated second shift value; and a processor operable to subtract a current offset value from a codeword of H bits taken from the bitstream;
shift the result by the associated shift value; and
address the associated data structure using the result.

According to another embodiment of the invention there is provided a method of decoding a bitstream encoded according to a Huffman coding tree of height H comprising:
storing a first data structure comprising a value for each possible node at a first level of the tree;
storing a second data structure comprising a value for each possible node within a first sub-tree at a second, lower level of the tree;
extracting a first codeword of H bits from the bitstream;
converting the value of the first codeword into a first node position within the tree at the first level of the tree; and
accessing the first data structure to obtain the value corresponding to the first node position, wherein that value refers to the second data structure;
converting the value of the first codeword into a second node position within the first sub-tree at the second level of the tree; and
accessing the second data structure to obtain the value corresponding to the second node position.

According to another embodiment of the invention there is provided a method of decoding a codeword from a bit stream comprising:
receiving a representation of a Huffman tree as a plurality of ordered data structures comprising: a first data structure associated with an identified first level L1 of the tree and comprising a plurality of data entries, each entry corresponding to a node of a full tree at the identified first level and at least a second data structure associated with an identified second level L2 of the tree and with an identified first sub-tree and comprising a plurality of data entries, each entry corresponding to a node of the first sub tree, when full, at the second identified level;
obtaining a value for a first level L1 in a Huffman tree identifying the node in the first level L1 of the tree, when full, corresponding to the first L1 bits of the codeword;
obtaining from the first data structure a data entry for the identified node, that identifies a further data structure if the identified node is an interior node and otherwise identifies a symbol; and
if the identified node is an interior node:
obtaining a value for a second level L2 in a Huffman tree, being a higher level than the first level L1;
obtaining a value identifying a first sub-tree;
identifying the node in the second level L2 of the first sub-tree, when full, corresponding to the first L2 bits of the received bit stream;
obtaining from a further data structure a data entry for the identified node, that identifies a further data structure if the identified node is an interior node and otherwise identifies a symbol.

According to another embodiment of the invention there is provided data representing a Huffman coding tree comprising leaf nodes and interior nodes arranged in H levels, wherein each leaf node depends from a single interior node on the next lowest level and represents a symbol and each interior node depends from a single interior node on the next lowest level, the data comprising:
a first data structure identifying, for each of the nodes within a first specified level of the tree, a symbol for each leaf node and a further data structure for each interior node, including a second data structure for a first interior node;
at least a second data structure, identified by the first data structure, identifying for each of the nodes within a sub-tree, depending from the first interior node, and at a second specified level of the tree, a symbol for each leaf node and a further data structure for an interior node, if any; and
data specifying at least the first level, the second level and the first interior node.

According to another embodiment of the invention there is provided a method of representing a Huffman binary tree comprising:
producing a first data structure associated with an identified first level L1 of the tree and comprising a plurality of data entries, each entry corresponding to a node of a full tree at the identified first level and identifying a further data structure if that node is an interior node and otherwise identifying a symbol; and
producing at least a further data structure associated with an identified second level L2 of the tree and with an identified first sub-tree and comprising a plurality of data entries, each entry corresponding to a node of the first sub tree, when full, at the second identified level L2 and identifying a further data structure if that node is an interior node and otherwise identifying a symbol.

One advantage associated with embodiments of the invention are that the technique utilizes the probability of occurrence of codewords. The more frequently occurring codewords will be decoded first.

Another advantage associated with embodiments of the invention is the low processing overhead associated with decoding—in each decoding iteration there is only a maximum of one subtraction, one shift and one compare. The decoding can consequently be implemented very efficiently in a digital signal processor (DSP).

Another advantage associated with embodiments of the invention is that the maximum search can be designed to be less than $\log_2 N$

BRIEF DESCRIPTION OF THE DRAWINGS

For a better understanding of embodiments of the present invention and to understand how the same may be brought into effect, reference will now be made by way of example only to the accompanying drawings in which.

DETAILED DESCRIPTION OF EMBODIMENTS OF THE INVENTION

Coding

Figure 1:
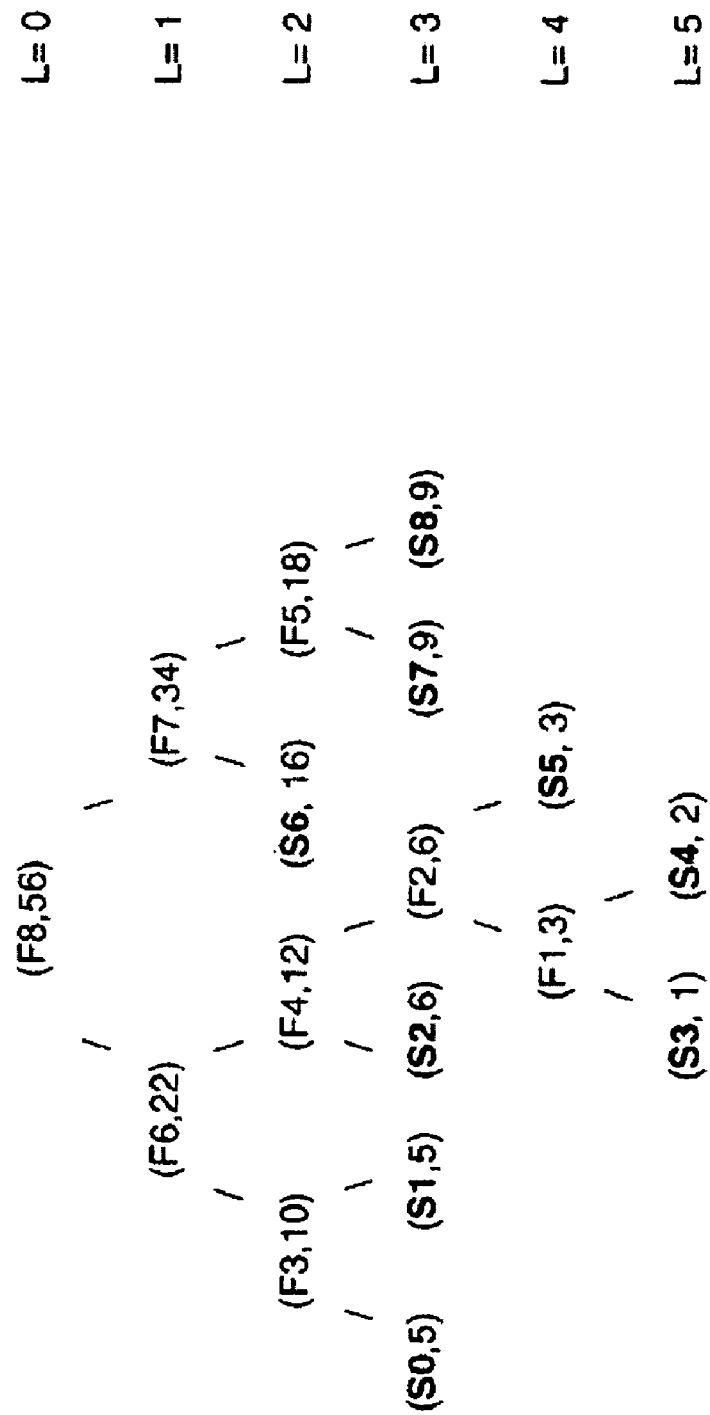
FIG. 1 illustrates a Huffman binary tree.

In this example, let there be nine symbols S0, S1 . . . S8 with the following respective frequencies of occurrence 5, 5, 6, 1, 2, 3, 16, 9, 9. They can be encoded using the Huffman algorithm into the binary tree illustrated in FIG. 1.

This Huffman tree can be represented as an ordered sequence of data structures as defined below in the following look-up tables (Tables 2, 3 and 4).

TABLE 2

| Lookup table | Offset_value | Shift_value | Sub_table |
|---|---|---|---|
| Lookup table 0 | 0 | 2 | 0 |
| Lookup table 1 | 12 | 0 | 1 |

TABLE 3 sub-table 0

| | y | | | | | | | |
|---|---|---|---|---|---|---|---|---|
| | 0 | 1 | 2 | 3 | 4 | 5 | 6 | 7 |
| symbol_locate | ->S0 | ->S1 | ->S2 | ->sub-table 1 | ->S6 | ->S6 | ->S7 | ->S8 |

TABLE 4 sub table 1

| | y | | | |
|---|---|---|---|---|
| | 0 | 1 | 2 | 3 |
| symbol locate | ->S3 | ->S4 | ->S5 | ->S5 |

The first data structure (Table 2) is a first look-up table. It identifies an offset_value and shift_value pair to be used with each identified sub-table. In this example, it designates that a zero offset and shift_value of 2 should be used with sub-table 0 (Table 3) and that an offset_value of 12 and a shift_value of 0 should be used with sub-table 1 (Table 4).

The second data structure (Table 3) is a look-up table. It is addressed using a value y and provides in return a value for symbol_locate. The value for symbol_locate may either point to a symbol value or point to another look-up table. For example, the values for y equal to 0, 1, 2, 4, 5, 6, 7 respectively point to the symbols S0, S1, S2, S6, S6, S7, S8 and the value for y equal to 3 points to sub-table 1 (Table 4).

The third data structure (Table 4) is a look-up table. It is addressed using a value y and provides in return a value for symbol_locate. The value for symbol_locate may either point to a symbol value or point to another look-up table. In this example the values for y equal to 0, 1, 2, 3 respectively point to the symbols S3, S4, S5, S5.

The 8-bit symbol_locate may be formatted so that its most significant bit (MSB) identifies whether it is a pointer to a symbol (MSB=0) or a pointer to another look-up table (MSB=1). Bits 1-7 gives an address of the correct symbol or look-up table. For example, the value of symbol_locate in sub-table at y=3 would be 1000 0001 indicating sub-table 1. The value of symbol_locate in sub-table 0 at y=1 would be 0000 0000 indicating symbol S0 according to Table 5 below.

TABLE 5

| symbol locate | Symbol |
|---|---|
| 0000 0000 | S0 |
| 0000 0001 | S1 |
| 0000 0010 | S2 |
| 0000 0011 | S3 |
| 0000 0100 | S4 |
| 0000 0101 | S5 |
| 0000 0110 | S6 |
| 0000 0111 | S7 |
| 0000 1000 | S8 |

The creation of the above described data structures will now be described. Table 6 illustrates the methodology used to create the data structures.

In Table 6, column 1 lists in order the symbols Si for 1=0, 1, 2 . . . N−1. Column 2 list adjacent each symbol its codeword. Column 3 gives the count value $\text{Count}_{Si}$ for each codeword.

$\text{Count}_{Si}$ is the value of the sequence of bits obtained by adding 1's to the codeword for symbol Si until it has a length H. For example, the count value for S0 is the value of 00011 (2+1), the count value of S2 is the value of 01011 (8+2+1). Alternatively the count value $\text{Count}_{Si}$ may be calculated, for each symbol Si occupying a level $L_i$ and a codeword of value V, as $[(V+1)*2^{(H-L_i)}]-1$. E.g. for S3 {01100}, V=12 & L=0, and count=$[(12+1)*(2^0)]-1=12$ and for S8 {111}, V=7 & L=2, and count=$[(7+1)*(2^2)]-1=31$.

Column 4 gives a factor for each symbol. This is calculated, for symbol Si, as $\text{count}_{Si}-\text{count}_{Si-1}$, where $\text{count}_{S-1}=-1$. It may alternatively be calculated, for Symbol Si at level $L_i$, as $2^{(H-L_i)}$.

Column 5 gives the 'shift' for each symbol. It is the logarithm to the base 2 of the symbol's factor. The shift may alternatively be calculated, for each symbol Si, as $L_i$.

TABLE 6

| 1 Si | 2 Codeword | 3 $\text{Count}_{Si}$ | 4 Factor $2^{(H-L_i)}$ | 5 Shift $H-L_i$ | 6 y = (x − 0) >> 2 | 7 y = (x − 12) >> 0 | 8 | 9 |
|---|---|---|---|---|---|---|---|---|
| S-1 | | −1 | | | | | | |
| S0 | 000 | 3 (011) | 4 | 2 | 0 (0) | — | | |
| S1 | 001 | 7 (111) | 4 | 2 | 1 (1) | — | | |
| S2 | 010 | 11 (1011) | 4 | 2 | 2 (10) | — | | |
| S3 | 01100 | 12 (1100) | 1 | 0 | 3 (11) | 0 | | |
| S4 | 01101 | 13 (1101) | 1 | 0 | 3 (11) | 1 | | |
| S5 | 0111 | 15 (1111) | 2 | 1 | 3 (11) | 3 | | |
| S6 | 10 | 23 (10111) | 8 | 3 | 5 (101) | — | | |
| S7 | 110 | 27 (11011) | 4 | 2 | 6 (110) | — | | |
| S8 | 111 | 31 (11111) | 4 | 2 | 7 (111) | — | | |

Equation 1 is used to calculate the values in columns 6 and 7, which provide the content for the second and third data structures (Tables 3 and 4).

$$y=(x-\text{offset\_value})>>(\text{shift\_value}) \quad \text{Equation 1}$$

where x is the value of a codeword, offset-value is an integer greater than or equal to 0, and shift value is an integer greater than or equal to 0. The operator ">>" indicates that the value (x−offset_value) should be truncated by shift_value, losing shift_value of its least significant bits. This shift operation to the left is equivalent to a divide by 2^shift_value operation but is easily performed by a digital signal processor (DSP).

For column 6 i.e. the second data structure (Table 3) the offset_value is set to zero and the shift_value is set to 2. The equation y=(x−0)>>2 is used to calculate each of the entries in column 6, which correspond to y values in sub-table 0

(Table 3). The symbols S3, S4 and S5 share a common y value. A further sub-table is used for these symbols.

For column 7 i.e. the third data structure (Table 4) the offset_value is 12 and the shift_value is set to 0. The equation y=(x−12)>>0 is used to calculate each of the entries in column 7 for unresolved symbols S3, S4 and S5, which correspond to the y values in sub-table 1 (Table 4).

Consequently, the sub-table 0 represents the nodes in the Huffman binary tree of FIG. 1 at a level Li that is shift_value levels removed from the top of the tree i.e. Li=H−shift_value.

The nodes at L=3, in order are, S0, S1, S2, F2, empty, empty, S7, S8. The empty nodes would depend from a leaf node associated with symbol S6. The symbol S6 is therefore placed in the dependant empty nodes. The nodes at L=3, can be re-written as S0, S1, S2, F2, S6, S6, S7, S8. This corresponds to the content of the entries in sub-table 0.

The internal node F2, is the root of a sub-tree. The sub-table 1 represents this sub-tree. The count value of any leaf nodes that depend from F2 will have values between 12 and 15. The count values of the codewords are renormalized by subtracting 12, the offset value for sub-table 1.

The sub-table 1 represents the nodes of the sub-tree at a level L in the Huffman binary tree equal to H−shift_value. Shift_value, for sub-table 1, is zero for this sub-tree so L=5.

The nodes at L=5 are, in order, S3, S4, empty, empty. The empty nodes would depend from a leaf node associated with symbol S5. The symbol S5 is therefore placed in the dependant empty nodes. The nodes at L=5 can be rewritten as S3, S4, S5, S5. This corresponds to the content of the entries in sub-table 1.

The Huffman tree in FIG. 1 is therefore represented by a first data structure, sub-table 0, representing the tree at level L=3 and by a second data structure, sub-table 1, representing a sub-tree at level L=5.

Sectioning the tree is necessary to allow the most probable symbols to be found first in an efficient manner. However, the introduction of too many sections uses additional memory to store the additional sub-table and additional shift and offset values and requires additional processing steps to decode the less commonly occurring symbols.

For example, it is possible to represent the Huffman tree by sectioning it at different levels than L=3 and L=5. For example, if the tree is sectioned at L=3, L=4 and L=5, there will be three sub-tables. The first entry of the sub-table for L=4 will refer to the sub-table for L=5 and the second entry will refer to S5. The first entry of the sub-table for L=5 will refer to S3 and the second entry will refer to S4. The offset for both these sub-table is 12. The shift for the sub-table for L=4 is 1 and the shift for the sub-table for L=5 is 0.

The following should be noted for the sectioning of the Huffman tree of FIG. 1 that gave the data structures of Tables 2, 3, 4 and 5.

A data structure representing a level L of a tree (i.e. a tree sectioned at L) has a shift value equal to H−L. A data structure referenced from a node N in the tree, where the node N has a codeword value V and is in level L, has an offset_value $V*2^{(H-L)}$.

For the sub-table 0, the shift value is set equivalent to H−L*, where L* is the level at which the tree is sectioned. Here it is the lowest level on which multiple leaves appear. In FIG. 1 there is one leaf at L=2, but multiple leaves at L=3. Therefore the tree is sectioned at L=3 and the shift_value=2. The offset_value is 0.

For example, the sub-table 1 is referenced via node {011} at L=3. V=3, therefore the offset_value for the sub-table 1 is $3*2^2$. The shift value for the sub-table 1 is set equivalent to H−L*, where L* is the level at which the tree is sectioned. Here, it is the lowest level on which multiple leaves appear in the sub-tree. In FIG. 1 the sub-tree has as its root F2 in level L=3. This sub-tree has one leaf at L=4, but two at L=5. Therefore the tree is sectioned at L=5 and shift_value=0.

Figure 2:
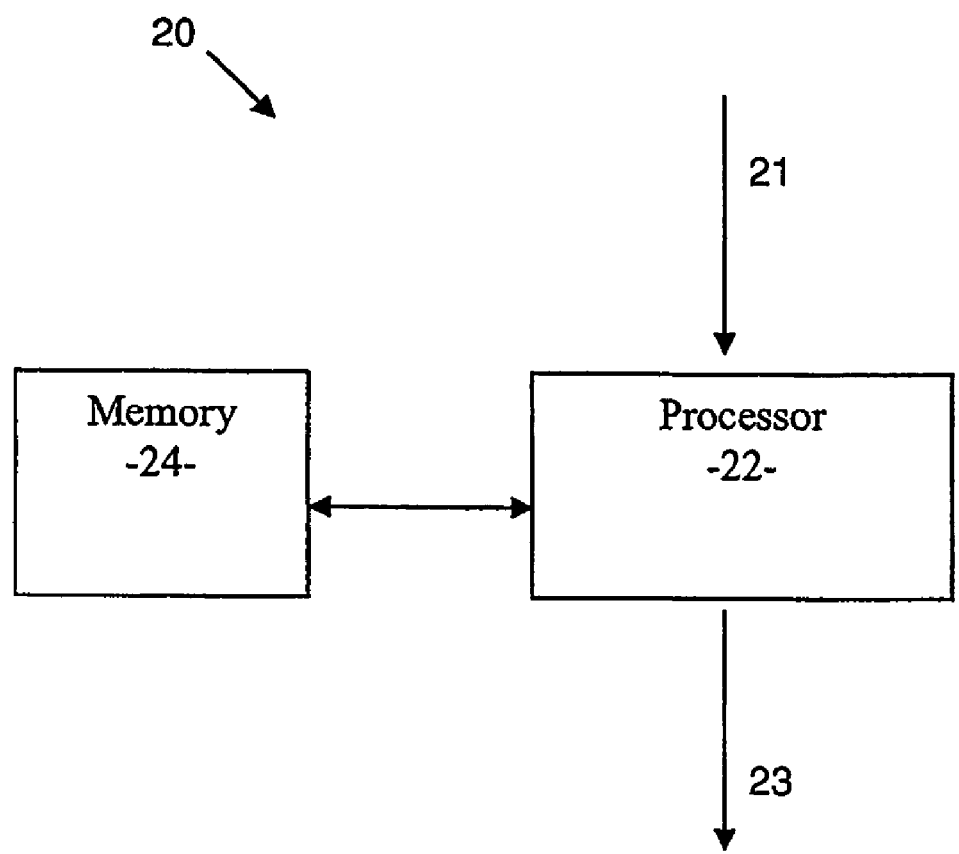
FIG. 2 illustrates a device that is usable as an encoder and/or decoder.

FIG. 2 illustrates a device 20 that is operable as an encoder. The encoder device comprises a processor 22 and a memory 24. The memory 24 stores computer program instructions that control the processor 22 to carry-out the encoding process described above.

The computer program instructions may be transferred to the memory via a suitable storage medium in which the instructions are embodied or they may be transferred via electrical signals embodying the instructions.

The processor 22 has an input 21 for receiving data for encoding and has an output 23 for providing encoded data. The encoded data includes a plurality of data structures representing a Huffman tree and a value for the height H of the tree.

Decoding

FIG. 2 illustrates a device 20 operable an a decoder. The decoder comprises a processor 22 and a memory 24. The memory stores data structures representing a Huffman tree as described above. For example the memory 24 may store tables corresponding to those illustrated in Tables 2, 3, 4 and 5 above. The memory also stores computer program instructions that control the processor 22 to carry-out the decoding process described below with reference to FIG. 3.

The computer program instructions may be transferred to the memory via a suitable storage medium in which the instructions are embodied or they may be transferred via electrical signals embodying the instructions.

The processor 22 has an input 21 for receiving data for decoding and has an output 23 for providing decoded data. The height of the Huffman tree is known in the decoder. This may be communicated to the decoder in a header provided with the data for decoding.

Figure 3:
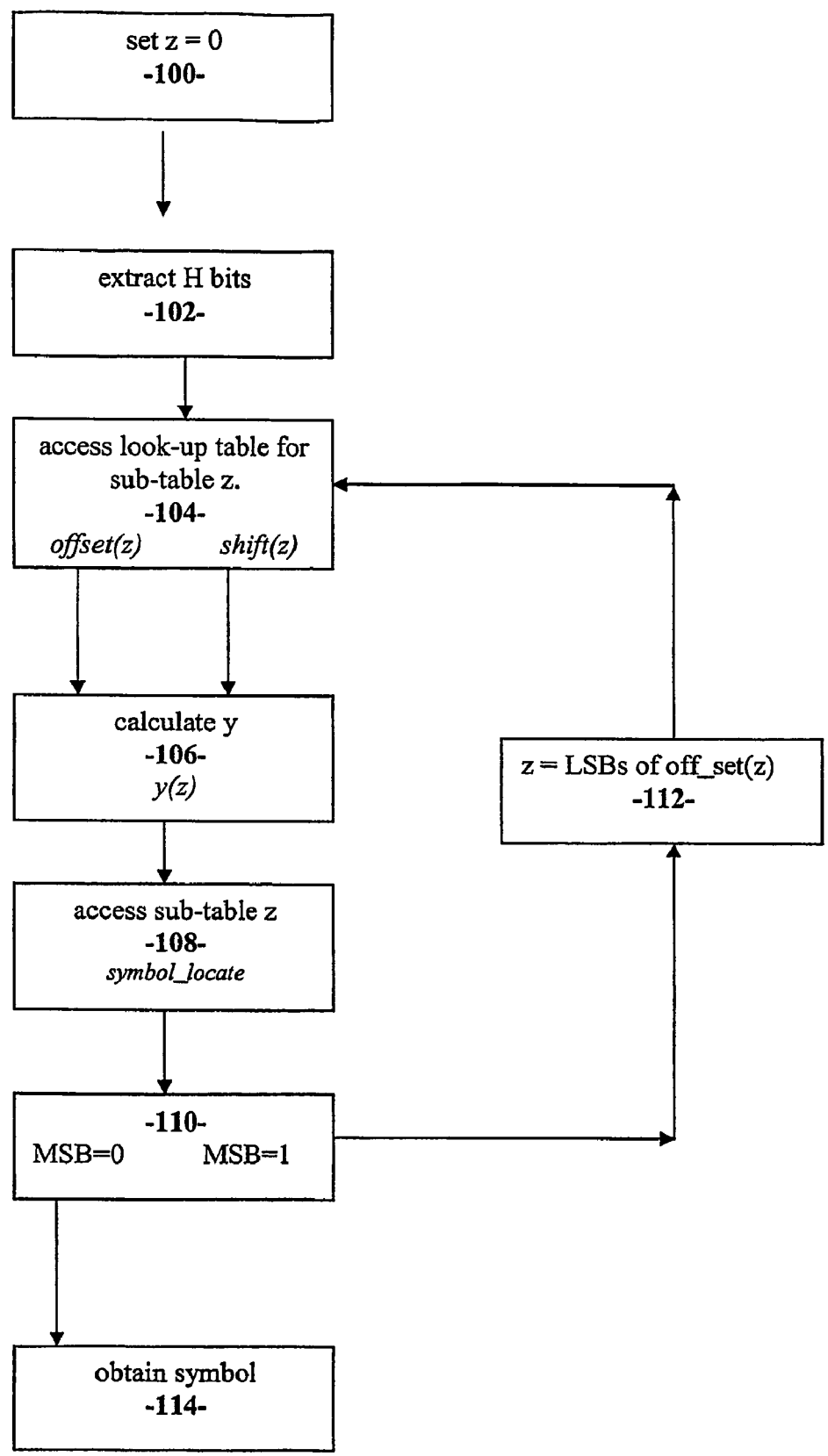
FIG. 3 illustrates the decoding process.

The decoder performs the following steps as illustrated in FIG. 3:

At step 100 the current sub-table identifier z is set to zero.

Then at step 102, H bits are extracted from the bitstream, having a value x

Then at step 104, the look-up table is accessed. The offset_value and shift_value for sub-table z is obtained.

Then at step 106, calculate a y value for the current sub-table from equation 1 using x and the obtained values of offset_value and shift_value for the current sub-table.

Then at step 108, access the current sub-table, sub-table z. Obtain the symbol_locate from sub-table z corresponding to the calculated y value.

Then at step 110, a comparison is performed on the MSB of the obtained symbol_locate. If the MSB of the obtained symbol_locate is 0 then the process jumps to step 114 If the MSB of the obtained symbol_locate is 1, the process jumps to step 112.

At step 112, the current sub-table identifier z is set equal to the remaining least significant bits of the symbol_locate obtained at step 108. Then the process returns to step 104.

At step 114, the symbol corresponding to by the symbol_locate obtained at step 108.

An example of the process illustrated will now be given using the example look-up tables given above (Tables 2, 3, 4 and 5). The codeword to be searched is {0, 1, 1,1 }. Let the extracted bits be {0, 1, 1, 1, 0}.

At step 100, set the current sub-table indicator z=0

At step 102, extract bits {0, 1, 1, 1, 0}. Therefore x=14.

At step 104, access the look-up table (Table 2). The offset_value for sub-table 0=0 and the shift_value for sub-table 0=2.

At step 106, calculate y using equation 1.

$$y=(x-0)>>2=3$$

At step 108, access the current sub-table, sub-table 0 (Table 3). Obtain the symbol_locate from sub-table 0 corresponding to the calculated y value. The symbol_locate is {1000 0001}.

At step 110, the MSB of the obtained symbol_locate is determined to be 1, therefore go to step 112.

At step 112, z is set equal to the remaining least significant bits {000 0001} of the obtained symbol_locate i.e. z=1.

At step 104, access the current look-up table (Table 2). Obtain a new offset_value and a new shift_value for the new current sub-table (sub-table 1). The offset_value for sub-table 1=12 and the shift_value for sub-table 1=0.

At step 106, calculate y for current sub-table, sub-table 1, using equation 1.

$$y=(x-12)>>0=2$$

At step 108, access the current sub-table (sub-table 1). Obtain the symbol_locate corresponding to the new y value (y=2). The symbol_locate is {0000 0101}.

At step 110, the MSB, of the obtained symbol_locate is determined to be 0, therefore go to step 114.

At step 114, obtain the symbol corresponding to the obtained symbol_locate. The symbol corresponding to the obtained symbol_locate {0000 0101} is, from Table 5, S5.

It will be understood that the same result will be achieved if the extracted bits are {0, 1, 1,1,1} instead of {0, 1, 1, 1, 0}.

Further Illustration

Figure 4:
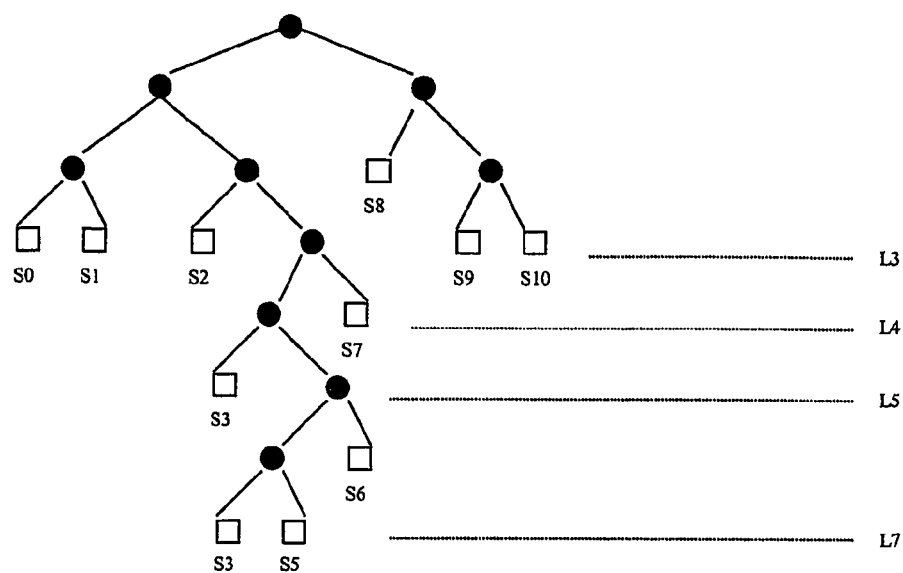
FIG. 4 illustrates another Huffman tree.

As a further illustration the encoding of the Huffman tree illustrated in FIG. 4 will now be briefly described.

| Si | codeword | count$_{Si}$ |
|---|---|---|
| S0 | 000 | 15 |
| S1 | 001 | 31 |
| S2 | 010 | 47 |
| S3 | 01100 | 51 |
| S4 | 0110100 | 52 |
| S5 | 0110101 | 53 |
| S6 | 011011 | 55 |
| S7 | 0111 | 63 |
| S8 | 10 | 95 |
| S9 | 110 | 111 |
| S10 | 111 | 127 |

Sectioning the tree at L=3, gives $y=(x-0)>>4$

| | y0 | | | | | | | |
|---|---|---|---|---|---|---|---|---|
| | 0 | 1 | 2 | 3 | 4 | 5 | 6 | 7 |
| symbol_locate | S0 | S1 | S2 | Goto table1 | S8 | S8 | S9 | S10 |

Sectioning the tree at L=4, gives $y=(x-48)>>3$, where $V\{011\}*2^4=48$

| | y1 | |
|---|---|---|
| | 0 | 1 |
| symbol_locate | Goto table2 | S7 |

Sectioning the tree at L=5, gives $y=(x-48)>>2$, where $V\{0110\}*2^3=48$

| | y2 | |
|---|---|---|
| | 0 | 1 |
| symbol_locate | S3 | Goto table3 |

Sectioning the tree at L=7, gives $y=(x-52)>>0$, where $V\{01101\}*2^2=52$

| | y3 | | | |
|---|---|---|---|---|
| | 0 | 1 | 2 | 3 |
| symbol_locate | S4 | S5 | S6 | S6 |

Although the present invention has been described with reference to various particular examples, it should be understood the various variations and modification can be made without departing from the spirit and scope of the invention.

The invention claimed is:

1. A method of decoding a bitstream encoded according to a Huffman coding tree of height H comprising:
   extracting a first codeword of H bits from the bitstream;
   modifying the codeword by shifting it by a first shift value;
   using this modified codeword to identify using at least a first data structure either a symbol or a second different data structure having a second offset value and a second shift value; and
   if a second data structure is identified using the first data structure:
   modifying the codeword by subtracting the second offset value and shifting the result by the second shift value; and
   using this modified codeword to identify using the second data structure either a symbol or a third different data structure having a third offset value and a third shift value.

2. A method as claimed in claim 1, further comprising accessing a look-up table to obtain the first shift value and accessing the look-up table to obtain the second offset value and the second shift value.

3. A method as claimed in claim 1, wherein the first data structure represents a first level of the Huffman coding tree and the second data structure represents a second, lower level of the Huffman coding tree.

4. A method as claimed in claim 1, further comprising receiving at least a value of H, the first shift value, the second offset value, the second shift value, the first data structure and the second data structure.

5. A method as claimed in claim 1, wherein the step of modifying the codeword by shifting it by the first shift value comprises firstly subtracting a first off-set value, if any, from the codeword and then shifting the result by the first shift value.

6. A storage medium or transmission medium embodying a computer program for performing the method of claim 1.

7. A method of decoding a bitstream encoded according to a Huffman coding tree of height H comprising:
   extracting a codeword of H bits from the bitstream;
   modifying the codeword by firstly subtracting a first off-set value, if any, from the codeword to obtain a result and then shifting the result by a predetermined shift value; and
   using the modified codeword to identify a symbol using at least a first data structure.

8. A method as claimed in claim 7, further comprising accessing a look-up table to obtain the predetermined shift value.

9. A method as claimed in claim 7, wherein the first data structure represents a first level of the Huffman coding tree.

10. A method as claimed in claim 7, further comprising receiving at least the value of height H, the predetermined shift value, and the first data structure.

11. A storage medium or transmission medium embodying a computer program for performing the method of claim 7.

12. A decoder for decoding a bitstream encoded according to a Huffman coding tree of height H comprising:
   a memory for storing a plurality of data structures representing the Huffman coding tree of height H including at least a first data structure having an associated first offset value and an associated first shift value and a second data structure having an associated second offset value and an associated second shift value; and
   a processor operable to subtract an offset value from a codeword of H bits taken from the bitstream;
   shift the result by a shift value; and
   address a data structure using the shifted result.

13. A decoder as claimed in claim 12, wherein the first data structure represents a first level of the Huffman coding tree and the second data structure represents a second, lower level of the Huffman coding tree.

14. A decoder as claimed in claim 13, wherein the first shift value corresponds to the first level.

15. A decoder as claimed in claim 14, wherein the processor is operable having obtained a value from addressing the associated data structure, to perform a comparison using that value and in dependence upon the comparison either use the value to identify a symbol or a new current offset value.

16. A decoder as claimed in claim 15, wherein the comparison uses the MSB of the value.

17. A decoder as claimed in claim 15, wherein the current offset value is initially set to the first offset value.

18. A decoder as claimed in claim 13, wherein the second shift value corresponds to the second level.

19. A decoder as claimed in claim 13 wherein the second offset value identifies a position of a first sub-tree within the Huffman tree.

20. A method of decoding a bitstream encoded according to a Huffman coding tree of height H comprising:
   storing a first data structure comprising a value for each possible node at a first level of the tree;
   storing a second data structure comprising a value for each possible node within a first sub-tree at a second, higher level of the tree;
   extracting a first codeword of H bits from the bitstream;
   converting a value of the first codeword into a first node position within the tree at the first level of the tree; and
   accessing the first data structure to obtain the value corresponding to the first node position, wherein that value refers to the second data structure;
   converting the value of the first codeword into a second node position within the first sub-tree at the second level of the tree; and
   accessing the second data structure to obtain the value corresponding to the second node position.

21. A storage medium or transmission medium embodying a computer program for performing the method of claim 20.

22. A method of decoding a codeword from a bit stream comprising: receiving a representation of a Huffman tree as a plurality of ordered data structures comprising: a first data structure associated with an identified first level L1 of the tree and comprising a plurality of data entries, each entry corresponding to a node of a full tree at the identified first level and at least a second data structure associated with an identified second level L2 of the tree and with an identified first sub-tree and comprising a plurality of data entries, each entry corresponding to a node of the first sub tree, when full, at the second identified level;
   obtaining a value for a first level L1 in a Huffman tree identifying the node in the first level L1 of the tree, when full, corresponding to the first L1 bits of the codeword;
   obtaining from the first data structure a data entry for the identified node, that identifies a further data structure or identifies a symbol; and
   if the data entry identifies a further data structure:
   obtaining a value for a second level L2 in a Huffman tree, being a higher level than the first level L1;
   obtaining a value identifying a first sub-tree;
   identifying the node in the second level L2 of the first sub-tree, when full, corresponding to the first L2 bits of the received bit stream;
   obtaining from a further data structure a data entry for the identified node, that identifies a further data structure or identifies a symbol.

23. A storage medium or transmission medium embodying a computer program for performing the method of claim 22.

24. Data representing a Huffman coding tree comprising leaf nodes and interior nodes arranged in H levels, wherein a leaf node depends from an interior node of the next lowest level and represents a symbol and wherein an interior node depends from an interior node of the next lowest level, the data comprising:
   a first data structure identifying, for each of the nodes within a first specified level of the tree, a symbol for each leaf node and a further data structure for each interior node, including a second data structure for a first interior node;
   at least a second data structure, identified by the first data structure, identifying for each of the nodes within a sub-tree, depending from the first interior node, and at a second specified level of the tree, a symbol for each leaf node and a further data structure for an interior node, if any; and
   data specifying at least the first level, the second level and the first interior node.

25. Data as claimed in claim 24, wherein the first data structure identifies a symbol for each empty node, if any.

26. Data as claimed in claim 24, wherein the second data structure identifies a symbol for each empty node of the sub-tree at a second level of the tree.

27. Data as claimed in claim 24, wherein the first level is the lowest level within the tree with at least two leaf nodes.

28. Data as claimed in claim 24, wherein the second level is the lowest level within the sub-tree with at least two leaf nodes.

29. Data as claimed in claim 24, wherein the first interior node, when at level L (L=0, 1, 2 . . . ) and having a value V, is specifying by a value dependent upon $V*2^{(H-L)}$.

30. Data as claimed in claim 24, further comprising data specifying H.

31. A storage medium or transmission medium embodying the data as claimed in claim 24.

32. A method of representing a Huffman binary tree comprising:
producing a first data structure associated with an identified first level L1 of the tree and comprising a plurality of data entries, each entry corresponding to a node of a full tree at the identified first level and identifying a further data structure if that node is an interior node and otherwise identifying a symbol; and
producing at least a further data structure associated with an identified second level L2 of the tree and with an identified first sub-tree and comprising a plurality of data entries, each entry corresponding to a node of the first sub tree, when full, at the second identified level L2 and identifying a further data structure if that node is an interior node and otherwise identifying a symbol.

33. A method as claimed in claim 32, running an algorithm to determine the number of data structures and their associated levels within the Huffman tree.

34. A method as claimed in claim 32 further comprising identifying a sub-tree having a root node at level L (L=0, 1, 2 . . . ) and value V using a value dependent upon $V*2^{(H-L)}$.

35. A decoder, comprising:
means for storing a plurality of data structures representing a Huffman coding tree of height H including at least a first data structure having an associated first offset value and an associated first shift value and a second data structure having an associated second offset value and an associated second shift value;
means for subtracting an offset value from a codeword of H bits taken from a bitstream to produce a result;
means for shifting the result by a shift value; and
means for addressing a data structure using the shifted result.

36. The decoder of claim 35, wherein the first data structure represents a first level of the Huffman coding tree and the second data structure represents a second, lower level of the Huffman coding tree.

37. The decoder of claim 36, wherein the first shift value corresponds to the first level.

38. The decoder of claim 36, wherein the second shift value corresponds to the second level.

39. The decoder of claim 36, wherein the second offset value identifies a position of a first sub-tree within the Huffman tree.

40. The decoder of claim 35, further comprising means, responsive to having obtained a value from addressing the data structure, for comparing using that value and in dependence upon a result of comparing to either use the value obtained from addressing the data structure to identify a symbol or a new current offset value.

41. The decoder of claim 40, wherein the comparing means use a most significant bit (MSB) of the value.

42. The decoder of claim 40, wherein the current offset value is initially set to the first offset value.

* * * * *

UNITED STATES PATENT AND TRADEMARK OFFICE
CERTIFICATE OF CORRECTION

PATENT NO. : 7,358,870 B2
APPLICATION NO. : 10/568009
DATED : April 15, 2008
INVENTOR(S) : Jiunn Bay It is certified that error appears in the above-identified patent and that said Letters Patent is hereby corrected as shown below:

Column 13, line 11 please delete "$V*2\hat{0}$ (H-L)" and replace with --$V*2^\wedge(H-L)$--.

Signed and Sealed this

First Day of July, 2008

JON W. DUDAS
*Director of the United States Patent and Trademark Office*